(12) United States Patent
Bhat et al.

(10) Patent No.: US 11,095,284 B2
(45) Date of Patent: Aug. 17, 2021

(54) MINIMIZING RINGING IN WIDE BAND GAP SEMICONDUCTOR DEVICES

(71) Applicant: Ford Global Technologies, LLC, Dearborn, MI (US)

(72) Inventors: Krishna Prasad Bhat, Canton, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/908,333

(22) Filed: Jun. 22, 2020

(65) Prior Publication Data

US 2020/0321959 A1 Oct. 8, 2020

Related U.S. Application Data

(63) Continuation-in-part of application No. 16/256,304, filed on Jan. 24, 2019, now abandoned, which is a continuation of application No. 15/494,359, filed on Apr. 21, 2017, now Pat. No. 10,193,544.

(51) Int. Cl.
| | |
|---|---|
| *H03B 1/00* | (2006.01) |
| *H03K 3/00* | (2006.01) |
| *H03K 17/16* | (2006.01) |
| *H02M 3/158* | (2006.01) |
| *H01L 29/16* | (2006.01) |

(52) U.S. Cl.
CPC ....... *H03K 17/168* (2013.01); *H01L 29/1608* (2013.01); *H02M 3/158* (2013.01); *H03K 17/163* (2013.01)

(58) Field of Classification Search
CPC .. H03K 17/0822; H03K 17/64; H03K 17/662; G11B 5/022; G11B 5/02
USPC .................................................. 327/108–112
See application file for complete search history.

(56) References Cited

U.S. PATENT DOCUMENTS

| | | | |
|---|---|---|---|
| 7,489,166 B2 * | 2/2009 | Honda | H03K 17/166 326/82 |
| 8,570,075 B2 * | 10/2013 | van Dijk | H03K 17/687 327/109 |
| 9,595,952 B2 * | 3/2017 | Braun | H03K 17/567 |
| 2006/0087300 A1 * | 4/2006 | Endo | G05F 1/618 323/282 |
| 2007/0195563 A1 * | 8/2007 | Shiraishi | H03K 17/165 363/25 |

(Continued)

*Primary Examiner* — Quan Tra
(74) *Attorney, Agent, or Firm* — Frank Lollo; Eversheds Sutherland (US) LLP

(57) ABSTRACT

Embodiments include a power conversion circuit comprising first and second semiconductor switches, and a drive circuit configured to create a period of operational overlap for the first and second switches by setting a gate voltage of the first switch to an intermediate value above a threshold voltage of the first switch, during turn-on and turn-off operations of the second switch. Embodiments also include a method of operating first and second semiconductor devices, comprising: reducing a gate voltage of the first device to an intermediate value above a threshold voltage while the second device is off; turning off the first device after the second device is on; increasing the gate voltage of the first device to the intermediate value while the second device is on; and fully turning on the first device after the second device is off.

20 Claims, 5 Drawing Sheets

(56) References Cited

U.S. PATENT DOCUMENTS

2014/0203849 A1\* 7/2014 Richardson .......... H03K 17/166
  327/109
2015/0043249 A1\* 2/2015 Iorio .................... H03K 17/302
  363/21.03

\* cited by examiner

MINIMIZING RINGING IN WIDE BAND GAP SEMICONDUCTOR DEVICES

CROSS-REFERENCE TO RELATED APPLICATIONS

This application is a continuation-in-part of U.S. patent application Ser. No. 16/256,304, filed Jan. 24, 2019, which is a continuation of U.S. patent application Ser. No. 15/494,359, filed Apr. 21, 2017, both of which are hereby incorporated by reference herein in their entirety.

TECHNICAL FIELD

This application generally relates to power electronics and more specifically, to minimizing ringing in power semiconductor devices.

BACKGROUND

The material properties of wide band gap (WBG) semiconductors, such as, for example, silicon carbide (SiC) or gallium nitride (GaN), permit operation at much higher voltages, frequencies, and temperatures than conventional semiconductors, including those made of silicon (Si) or gallium arsenide (GaAs). These features can lead to smaller and more energy-efficient circuits. Recently, WBG semiconductor devices are increasingly being used in high power applications, like high-speed switching for power modules and in charging modules for hybrid and all-electric vehicles.

One challenge facing most applications of WBG devices, including hard-switched power converter or inverter applications, is the occurrence of high frequency (e.g., greater than 30 megahertz (MHz)) ringing, or oscillations, during switching. This high frequency ringing induces electromagnetic interference (EMI) noises to surrounding circuitry (such as, e.g., control lines and measurement lines), as well as other sub-system components, thereby affecting overall system performance. The ringing is primarily caused by high voltage (dv/dt) and current (di/dt) transients induced by the WBG device during switching, which excites parasitic inductance (L) and capacitance (C) in the circuit, thereby causing the device to oscillate during switching.

Existing solution for minimizing parasitic inductance in WBG devices includes improving a packaging of the devices, for example, by reducing stray inductance resulting from the packaging. However, this solution can be expensive and difficult to achieve, especially in power modules rated for more than 300 amperes (A) and designed for use in hybrid and electric vehicles. Also, reducing packaging stray inductance does not eliminate the ringing that occurs during switching. Another existing solution attempts to minimize the ringing by adding external passive components, such as R/C (snubber circuits), to absorb the ringing energy. However, this solution requires the use of additional components, increases packaging cost and size, and reduces reliability during high temperature operation. In addition, the introduction of additional resistors and other external passive components reduces the device dv/dt, di/dt speeds, which in turn greatly increases the switching loss of the device. Another downside of these and other similar existing solutions is that they require external modifications to the WBG device that cannot be controlled or adjusted to manipulate the amount of ringing.

Accordingly, there is still a need in the art for techniques to minimizing ringing or oscillations in wide band gap semiconductor devices during high speed switching.

SUMMARY

The invention is intended to solve the above-noted and other problems by providing gate modulation techniques configured to create a period of operational overlap while switching between first and second semiconductor devices, the period of overlap minimizing the ringing that typically arises during switching by reducing lumped stray capacitance and increasing lumped loop resistance in the circuit. In addition, the techniques described herein utilize inherent characteristics of the semiconductor devices to control ringing and therefore, require no additional hardware and can be adjusted (e.g., enabled or disabled) as needed for a given practical application.

For example, one embodiment includes a power conversion circuit comprising first and second semiconductor switches, and a drive circuit configured to create a period of operational overlap for the first and second switches by setting a gate voltage of the first switch to an intermediate value above a threshold voltage of the first switch, during turn-on and turn-off operations of the second switch.

Another example embodiment includes a method of operating first and second semiconductor devices, comprising: reducing a gate voltage of the first device to an intermediate value above a threshold voltage while the second device is off; turning off the first device after the second device is on; increasing the gate voltage of the first device to the intermediate value while the second device is on; and fully turning on the first device after the second device is off.

As will be appreciated, this disclosure is defined by the appended claims. The description summarizes aspects of the embodiments and should not be used to limit the claims. Other implementations are contemplated in accordance with the techniques described herein, as will be apparent to one having ordinary skill in the art upon examination of the following drawings and detail description, and such implementations are intended to within the scope of this application.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
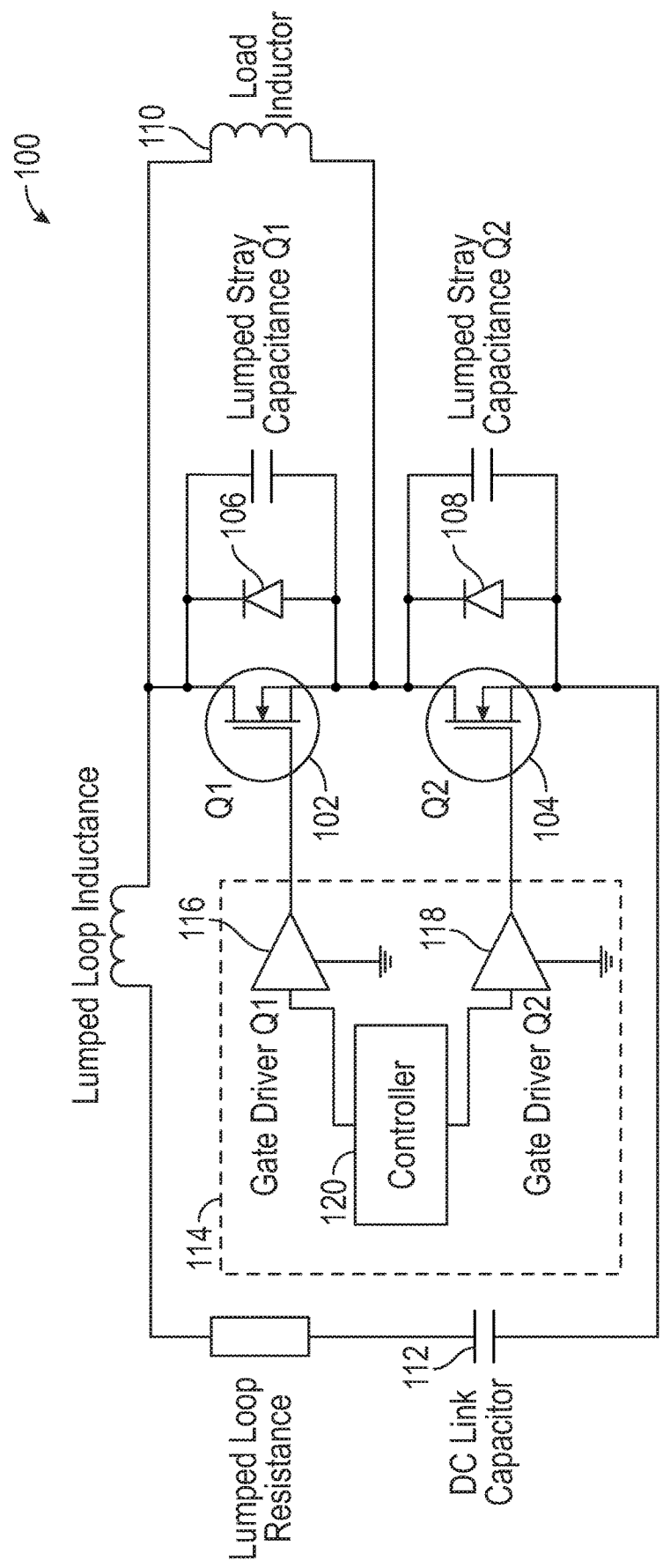
FIG. 1 is a circuit diagram illustrating an example configuration of a power conversion circuit that can accept application of certain embodiments.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects.

FIG. 1 illustrates an exemplary power conversion circuit 100 to which embodiments described herein can be applied. The power conversion circuit 100 represents at least a portion of a power converter for converting DC input voltage to DC output voltage, or a power inverter for converting DC input voltage to AC output voltage. In some cases, the power conversion circuit 100 forms part of a power module that may be included in, for example, an electric vehicle, hybrid electric vehicle (HEV), plug-in electric vehicle (PHEV), or battery electric vehicle (BEV). The power conversion circuit 100 may be included on a single integrated circuit (IC) or may comprise two or more ICs or modules electrically coupled together.

As shown in FIG. 1, the power conversion circuit 100 includes a power semiconductor device 102, or upper switch Q1, and a power semiconductor device 104, or lower switch Q2, connected in series. In the illustrated embodiment, the semiconductor devices 102 and 104 (also referred to herein as "transistors Q1 and Q2") are n-type metal-oxide semiconductor field-effect transistors (MOSFETs). In other embodiments, the semiconductor devices 102 and 104 may be another type of semiconductor device suitable for high frequency power switching applications (such as, e.g., IGBT). As shown, the semiconductor device 102 is connected in parallel to a power diode 106, and the semiconductor device 104 is connected in parallel to a power diode 108. The power diodes 106 and 108 may be any suitable type of semiconductor diode, such as, for example, a PIN diode, an antiparallel diode, or a Shottky diode. As shown, the semiconductor switch 102 and the power diode 106 form an upper arm of the power conversion circuit 100, while the semiconductor switch 104 and the power diode 108 form a lower arm of the circuit 100. In some cases, the power conversion circuit 100 may be configured such that the upper switch Q1 operates as a passive device, while the lower switch Q2 operates as an active device. In other cases, the power conversion circuit 100 may be configured such that the upper switch Q1 operates as an active device, while the lower switch Q2 operates as a passive device. In further cases, both the upper switch Q1 and the lower switch Q2 may operate as active devices.

The semiconductor devices 102 and 104 and/or the diodes 106 and 108 can be made from a wide bandgap (WBG) semiconductor material, such as, e.g., silicon carbide (SiC), gallium nitride (GaN), etc. In a preferred embodiment, each of the power switches 102 and 104 and the power diodes 106 and 108 are made of SiC in order to enable operation of the circuit 100 at higher switching frequencies. However, the faster rise and fall times obtained by pairing SiC switches with SiC diodes typically excite oscillations, or ringing, during both turn-on and turn-off operations, especially when using hard switching behavior, and may lead to cross talk and signal distortion.

As will be appreciated, various parasitic components may be unavoidably present in the circuit 100 (also referred to as a "power loop"). In FIG. 1, these parasitic components are illustrated as a lumped loop resistance associated with conductors in the power loop, a lumped loop inductance associated with the wiring or packaging of the power loop, and lumped stray capacitances Q1 and Q2 present in the upper and lower arms, respectively, of the power loop. The stray or parasitic inductive and capacitive components of the power circuit 100 typically give rise to considerable transient effects, including ringing or oscillations during switching.

As shown in FIG. 1, a first terminal of a load inductor 110 is connected between the upper and lower arms of the circuit 100, and a second terminal of the load inductor 110 is connected to the upper arm of the circuit 100. A DC link capacitor 112 is connected to the second terminal of the load inductor 110 and to the lower arm of the circuit 100. In some cases, the DC link capacitor 112 may be coupled in parallel to a DC power source or battery (not shown) to serve as a load-balancing energy storage device, for example, where the power conversion circuit 100 is included in a power inverter for converting the DC power to an AC power output.

As also shown, the power conversion circuit 100 further includes a drive circuit 114 for driving the semiconductor devices 102 and 104. The driver circuit 114 includes a gate driver 116 connected to a gate of the upper transistor Q1, a gate driver 118 connected to a gate of the lower transistor Q2, and a controller 120 configured to provide inputs to the gate drivers 116 and 118 for controlling gate voltages of the transistors Q1 and Q2, respectively. In the illustrated embodiment, the gate drivers 116 and 118 are power amplifiers configured to receive a low-power input from the controller 120 and produce a high-current drive input for the respective gates of the transistors Q1 and Q2. The controller 120 may be any suitable type of integrated circuit (IC) or microcontroller capable of providing an input to the gate drivers 116 and 118, such as, for example, a pulse-width modulation (PWM) controller. The drive circuit 114 may be implemented as a single integrated circuit comprising all of its components, or a collection of separate, dedicated integrated circuits, each comprising one or more components.

In certain cases, the power conversion circuit 100 converts DC power into AC power by performing on-off switching control on the semiconductor devices 102 and 104 using the drive circuit 114. In particular, using the corresponding gate driver 116, 118, the controller 120 controls the level of the gate voltage (Vgs) applied to the gate of each transistor Q1, Q2 to transition the respective semiconductor device 102, 104 between an on-state and an off-state. The level of Vgs required to fully turn on the transistors Q1, Q2 may be referred to herein as a maximum operating value or VgsHigh (e.g., 15 volts (V)). The level of Vgs required to turn off the transistors Q1, Q2 may be referred to herein as a minimum operating value or VgsLow (e.g., 0 V).

In some embodiments, the controller 120 utilizes a hard switching process, wherein the semiconductor devices 102 and 104 exhibit hard turn-on and hard turn-off behavior, for example, through use of a pulse width modulation (PWM) control signal. To achieve hard switching, the switching moment, or the time to transition from on to off or vice versa, is minimized by cutting off the load current within the turn-on or turn-off times. However, shortening the switching moment typically results in a higher frequency of electromagnetic interference (EMI), which can produce a more apparent noise problem.

During conventional operation of the power conversion circuit 100, the controller 120 alternately turns on the upper and lower switches 102, 104 to prevent a through current from flowing through both of the transistors Q1 and Q2 at the same time (also known as a "short-circuit" or "shoot-through" event). Moreover, to ensure that the semiconductor switches 102 and 104 are not inadvertently turned on at the same time (e.g., due to noise in the drive circuit 114 or a sudden change in di/dt) while transitioning from one switch to the other, both of the switches 102 and 104 are typically placed in the off-state for a predetermined period of time, known as "dead time." This is illustrated by FIG. 2, which is a time chart 200 comprising a first voltage waveform 202 representing gate voltage (Vgs) levels for the upper switch Q1 and a second voltage waveform 204 representing gate voltage (Vgs) levels for the lower switch Q2, during conventional operation of the circuit 100.

Figure 2:
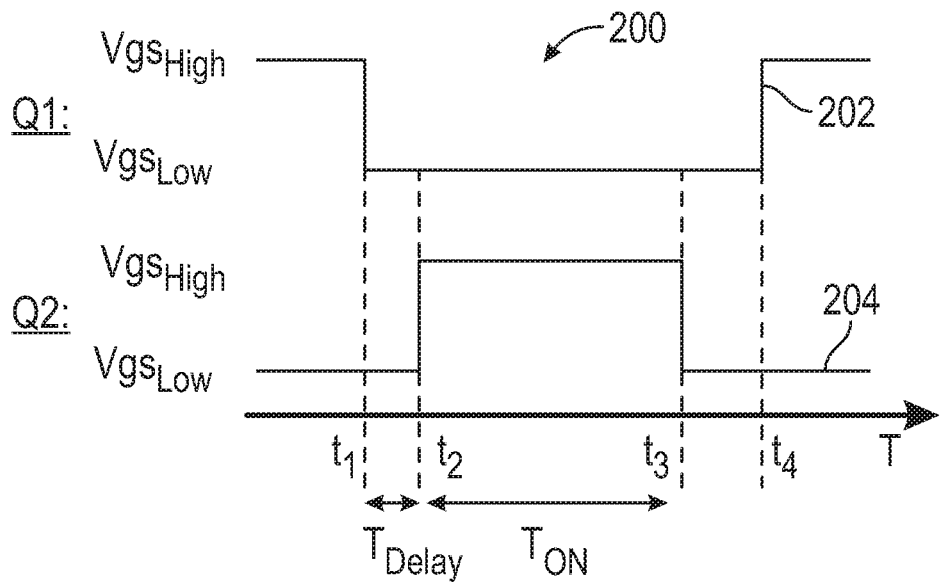
FIG. 2 is a time chart illustrating voltage waveforms during conventional operation of a power conversion circuit.

As shown in FIG. 2, the controller 120 inserts dead time, TDelay, after turning off the upper switch Q1 and before turning on the lower switch Q2, or from time t1 to t2. Similarly, though not labeled in FIG. 2, a second dead time is added between turning off the lower switch Q2 and turning on the upper switch Q1, or from time t3 to t4. Thus, as shown by the time period, TON, the lower switch Q2 turns on only after the dead time TDelay has passed, and turns off before the second dead time begins. As will be appreciated, the introduction of dead time typically causes an increase in power loss if it is excessively long. Thus, most circuit designers strive to minimize the required amount of dead time.

Figure 3:
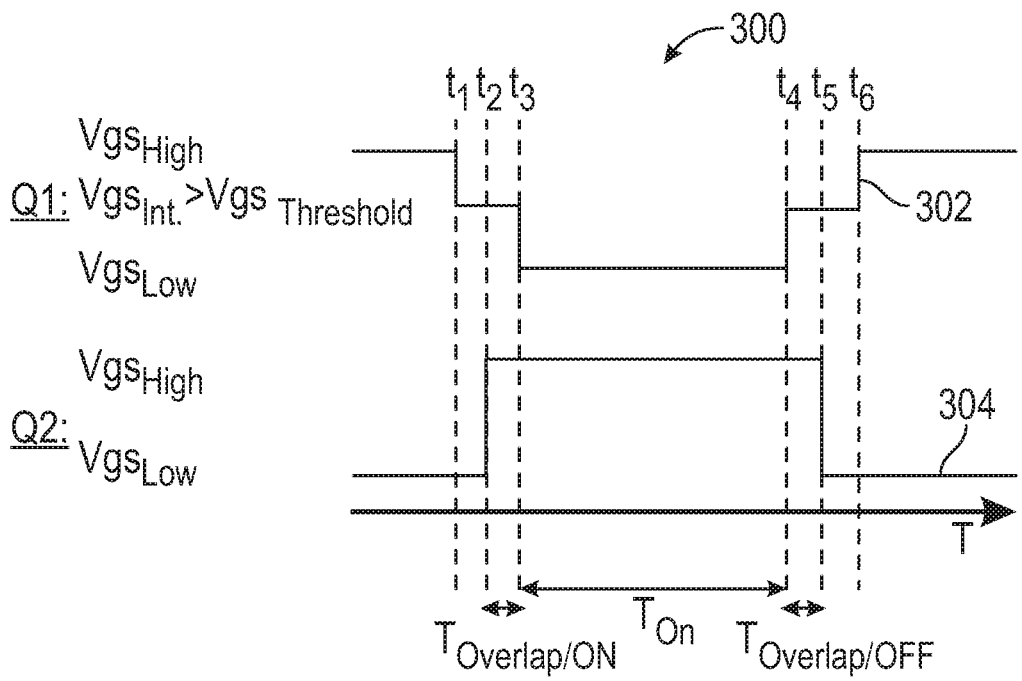
FIG. 3 is a time chart illustrating example voltage waveforms during application of a gate modulation technique to the power conversion circuit shown in FIG. 1, in accordance with certain embodiments.

FIG. 3 is a time chart 300 showing exemplary application of a gate modulation technique to the power conversion circuit 100 to minimize ringing during switching, in accordance with embodiments. In FIG. 3, a voltage waveform 302 represents operation of the upper switch Q1, or the semiconductor device 102 shown in FIG. 1, and a voltage waveform 304 represents operation of the lower switch Q2, or the semiconductor device 104 shown in FIG. 1. In embodiments, the voltage waveforms 302 and 304 may be achieved by using the drive circuit 114, or more specifically, the controller 120 included therein, to control operation of the switches Q1 and Q2 according to a pulse-width modulation (PWM) control signal. Generally, the gate modulation technique alters the conventional turn-on and turn-off operations of the transistors Q1 and Q2 by (1) adding an intermediate operating state between the on-and off-states of the upper switch Q1, wherein the gate voltage of Q1 is set to an intermediate value above a threshold voltage of the upper switch Q1, (2) using the intermediate state to create a period of operational overlap when switching operation between the upper switch Q1 and the lower switch Q2, and (3) virtually eliminating dead time during switching.

As shown in FIG. 3, a first period of operational overlap, TOverlap/ON is associated with a turn-on operation of the lower switch Q2, and a second period of operational overlap, TOverlap/OFF, is associated with a turn-off operation of the lower switch Q2. Initially, the upper switch Q1 is in an on-state, wherein the gate voltage of the transistor Q1 is set to VgsHigh, and the lower switch Q2 is in an off-state, wherein the gate voltage of the transistor Q2 is set to VgsLow. At time t1, the gate voltage of the upper switch Q1 is reduced or adjusted to an intermediate value, VgsInt, that is below the maximum operating value, VgsHigh, but above a gate threshold voltage, VgsThreshold. During the transition to the intermediate value, the lower switch Q2 remains in the off-state (e.g., from time t1 to time t2).

As will be appreciated, the gate threshold voltage is the minimum amount of charge required at the gate to ready the transistor for carrying current. Once the gate voltage, Vgs, crosses the threshold value, current starts flowing into the transistor. As a result, the transistor may be considered "on," in a technical sense, as long as the gate voltage exceeds the threshold voltage (e.g., Vgs>VgsThreshold). Accordingly, in FIG. 3, during the time interval t1 to t3, even though the gate voltage of the upper switch Q1 is reduced below the maximum operating value VgsHigh, the switch Q1 is still technically on because the gate voltage is above the threshold value.

At time t2, the lower switch Q2 is turned on by setting or adjusting the gate voltage of the transistor Q2 to the maximum operating value, VgsHigh. As shown in FIG. 3, this transition is completed while the gate voltage of the upper switch Q1 remains at the intermediate value, VgsInt. Thus, the first period of operational overlap, TOverlap/ON, starts at time t2, once both switches Q1 and Q2 are considered on. As shown in FIG. 3, the period TOverlap/ON ends at time t3 upon transitioning the upper switch Q1 to the off-state by setting the gate voltage of the transistor Q1 to VgsLow. As shown in FIG. 3, the lower switch Q2 remains in the on-state during this transition. Thus, the upper switch Q1 is in the intermediate state before and after the lower switch Q2 is turned on.

During the period of overlap, current flows through both transistors Q1 and Q2 at the same time, thus causing a short-circuit or shoot-through condition. According to embodiments, the period of overlap can be configured so that a controlled surge in current is momentarily achieved across both transistors Q1 and Q2. The current surge can be controlled in both magnitude and duration by selecting an appropriate intermediate value, VgsInt, for the upper switch Q1 and by selecting an appropriate length of time (e.g, t2 to t3) for the period of overlap, TOverlap/ON. In embodiments, the intermediate value, VgsInt, can be selected to be just high enough to cause the shoot-through event, but low enough to avoid damage to the power conversion circuit 100. For example, the VgsInt may be 1-2 volts above the threshold voltage for the upper switch Q1. Likewise, the length of time between t2 and t3 can be selected so as to avoid damage to the circuit 100 from the shoot-through condition.

Creation of the shoot-through event during the time period TOverlap/ON momentarily dissipates energy through the upper switch Q1, which lowers the lumped stray capacitance of the upper switch Q1 to a varied or non-existent state and increases the lumped loop resistance of the circuit 100. This reduces or minimizes oscillations that would normally appear during a turn-on operation of the lower switch Q2 and thus, allows the lower switch Q2 to be turned on at a relatively large impedance state.

As shown in FIG. 3, the upper switch Q2 remains fully on for a time period TON that starts at time t3, or after the short circuit event is removed, and ends at time t4. At time t4, the gate voltage of the upper switch Q1 is increased from the minimum operating value, VgsLow, to the intermediate value, VgsInt, while the lower switch Q2 remains in the on-state. Thus, from time t4 to time t5, a second period of operational overlap, TOverlap/OFF, is created by allowing current to pass through both transistors Q1 and Q2 at the same time.

Like the first period of overlap, the period TOverlap/OFF causes a controlled surge of current that can be controlled in magnitude and duration. Also like the first period of overlap, creation of the shoot-through event during the time period TOverlap/OFF momentarily dissipates energy through the upper switch Q1, which lowers the lumped stray capacitance of the upper switch Q1 to a varied or non-existent state and increases the lumped loop resistance of the circuit 100. This reduces or minimizes oscillations that would normally appear during a turn-off operation of the lower switch Q2 and thus, allows the lower switch Q2 to be turned off at a relatively low impedance state.

As shown in FIG. 3, the second period of overlap TOverlap/OFF ends at time t5 upon turning off the lower switch Q2 by reducing the gate voltage of the transistor Q2 to the minimum operating value, VgsLow. At time t6, the upper switch Q1 is turned on fully by increasing the gate voltage from the intermediate value VgsInt to the maximum operating value VgsHigh. As shown in FIG. 3, the lower switch Q2 remains off during this transition. Thus, the upper switch Q1 is in the intermediate state before and after turning off the lower switch Q2.

Figure 4:
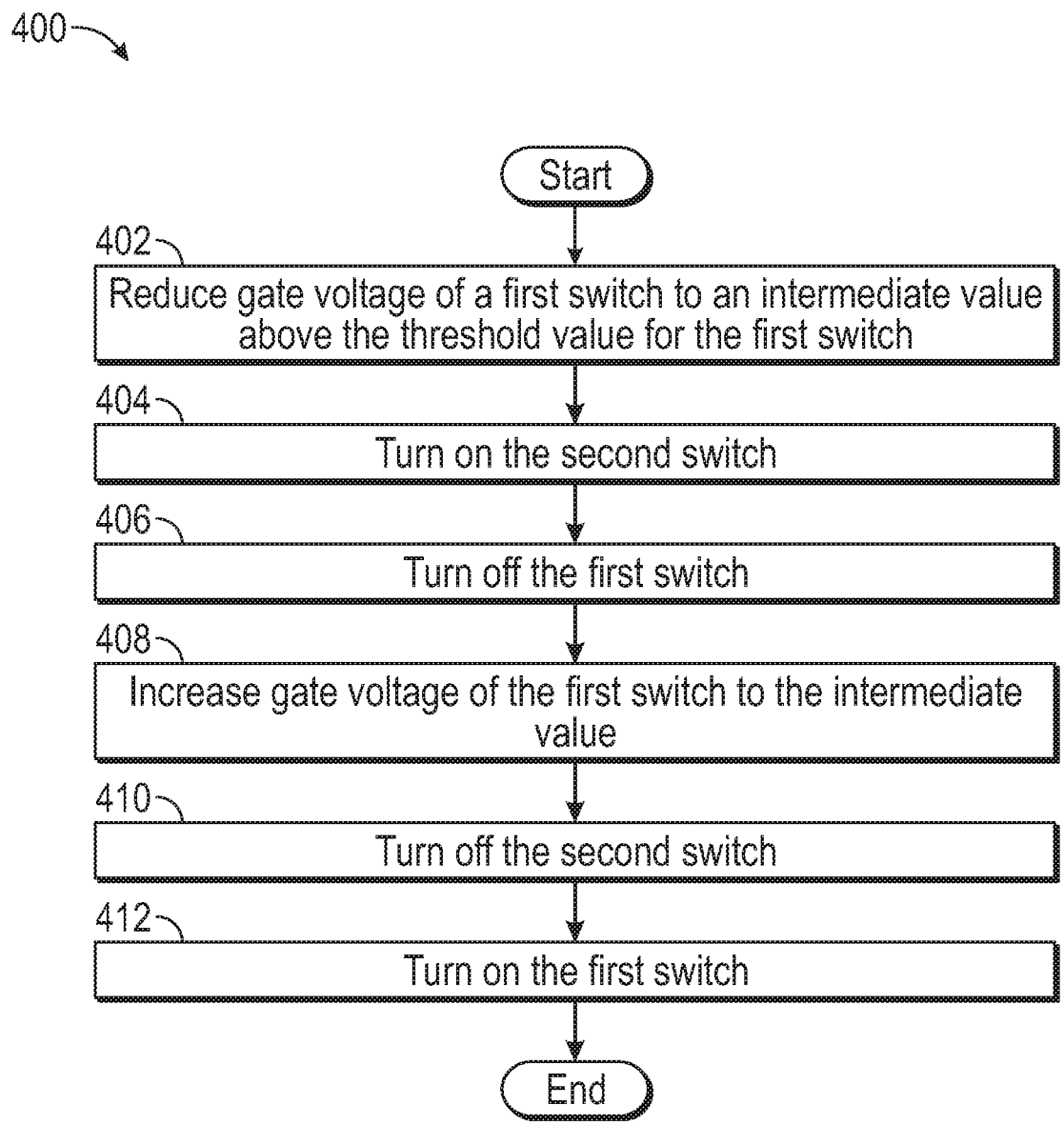
FIG. 4 is a flow diagram of an example method of operating first and second semiconductor devices in accordance with certain embodiments.

FIG. 4 illustrates a flow diagram of an example method 400 of operating first and second semiconductor switches in a power conversion circuit 100, such as, e.g., the power conversion circuit 100 shown in FIG. 1, in accordance with embodiments. The method 400 may include, or may be similar to, the gate modulation technique shown in FIG. 3 and described herein. The method 400 may be carried out by one or more processors (or controllers) included in the power conversion circuit. In one embodiment, the method 400 is implemented, at least in part, by the controller 120 of the drive circuit 114 executing software stored in a memory (not shown) of the drive circuit 114, and interacting with one or more components of the driver circuit 114, such as, for example, the gate drivers 116 and 118, and/or the power conversion circuit 100.

The method 400 begins at step 402, where a gate voltage of a first switch (e.g., upper switch Q1 of FIG. 3) is reduced to an intermediate value (e.g., VgsInt) above a threshold value (VgsThreshold) associated with the first switch, while a second switch (e.g., lower switch Q2 of FIG. 3) is in an off-state. At step 404, the second switch is turned on, or transitioned to an on-state, by increasing a gate voltage of the second switch from a minimum operating value, VgsLow, to a maximum operating value, VgsHigh. At this point, a first period of operational overlap begins as both the first switch and the second switch are technically on. During the period of overlap, a short circuit is formed across the two switches, thus delivering a controlled surge of current to the transistors Q1 and Q2. At step 406, while the second switch is on, the first switch is turned off by decreasing the gate voltage of the first switch from the intermediate value, VgsInt, to the minimum operating value, VgsLow. Thus, the first period of operational overlap ends at step 406, at which point the second switch continues to operate in the on-state.

The method 400 further includes step 408, where the gate voltage of the first switch is increased from the minimum operating value, VgsLow, to the intermediate value, VgsInt, while the second switch remains in the on-state. This initiates a second period of operational overlap. At step 410, the second switch is turned off, or transitioned to an off-state, by decreasing the gate voltage of the second switch from the maximum operating value, VgsHigh, to the minimum operating value VgsLow, thus ending the second period of overlap. At step 412, while the second switch is turned off, the first switch is fully turned on by increasing the gate voltage of the first switch from the intermediate value, VgsInt to the maximum operating value, VgsHigh. Thus, the second period of operational overlap beings at step 408, while both transistors are technically on, and ends at step 410, once the second switch is no longer on and before the first switch is fully on.

Figure 5:
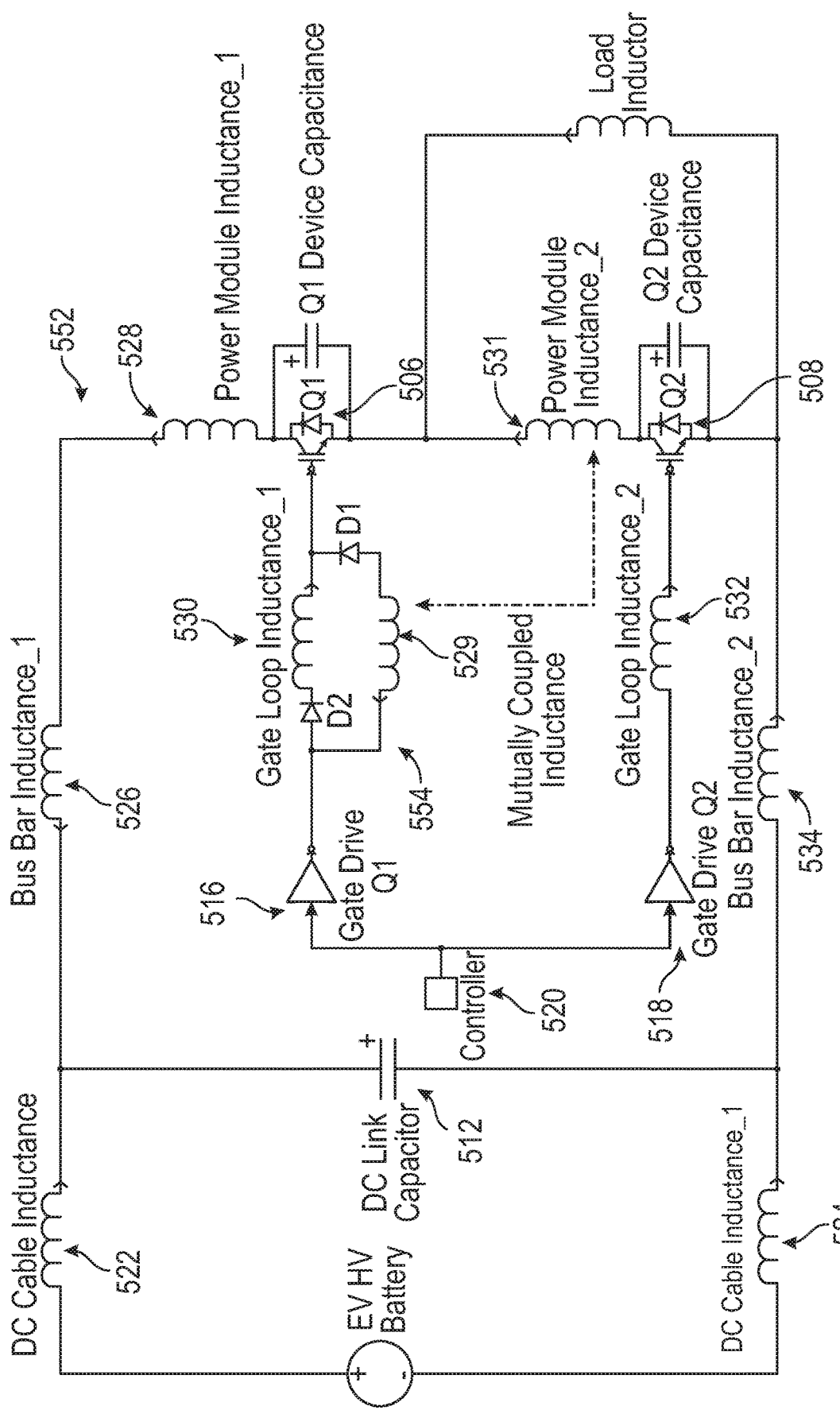
FIG. 5 illustrates an example application of an alternative gate modulation technique to a circuit, in accordance with certain embodiments.

FIG. 5 illustrates an example alternative gate modulation technique being applied to a circuit 500. The gate modulation technique applied to circuit 500 may differ from the gate modulation technique described above with respect to FIG. 3 in that the controller 520 in circuit 500 may only actively switch on/off one of the switches of Q1 and Q2. The circuit 500 depicted in FIG. 5 may be the same as (or include some similar elements to) the circuit 100 depicted in FIG. 1. For example controller 520 may be the same as controller 120, and so on. However, the circuit 500 may differ from the circuit 100 in that the circuit 500 may also depict a circuit loop associated with the gate driver 516, which may be referred to as the gate driver loop 554. That is, the circuit 500 may depict both a power loop 552 as described above with respect to circuit 100 depicted in FIG. 1, and may also include the gate driver loop 554. Although not depicted in the figure, a similar gate driver loop may also be associated with gate driver 518. That is, each of gate driver 516 and 518 may be associated with its own individual gate driver loop as well (or alternatively, only gate driver 518 may be associated with a gate driver loop). Additionally, instead of representing the parasitic inductances found in the circuit 500 as a single lumped loop inductance as is the case in FIG. 1, FIG. 5 may illustrate individual parasitic inductances found within the circuit 500, so that the concept of mutually coupled inductance as described below may be better illustrated. For example, such parasitic inductances found within the circuit 500 may include a first DC cable inductance 522, a second DC cable inductance 524, a first bus bar inductance 526, a second bus bar inductance 534, a power module inductance 528, a second power module inductance 531, all of which may be found in the power loop 552 of the circuit 552. The parasitic inductances may also include a first gate loop inductance 530 and a second gate loop inductance 529, both of which may be found in the gate driver loop 554 that is associated with the gate driver 516. The parasitic inductances may also include a third gate loop inductance 532, which may be found in another gate driver loop of the circuit 500 (for example, associated with grate driver 518) that is not depicted in the figure. It should be noted that the parasitic inductances depicted in FIG. 5 are merely exemplary, and other parasitic inductances may also exist in the circuit 500. Additionally, it should be noted that even though the above inductances are described as being parasitic, any of the inductances represented in this figure may also be physical inductors as well.

In some embodiments, the gate modulation technique illustrated in FIG. 5 may include using the controller 520 to only actively switch on/off one of the switches in the circuit 500 (for example, upper switch Q1 or the lower switch Q2). That is, the controller 520 may only to actively provide an input signal to either one of gate driver 514 associated with upper switch Q1 or gate driver 516 associated with lower switch Q2. While the controller 520 may only be used to actively switch either upper switch Q1 or the lower switch Q2, the switch that is not actively turned on/off by the controller 520 may instead be turned on/off passively. More particularly, the other switch (the switch that is not actively switched on by the controller 520) may instead be switched on through a mutually coupled inductance that is produced between two inductances in the circuit 500. For example, the inductances may be two parasitic inductances, two physical inductions, or a combination of the two. These inductances may always exist in circuit 500, but may not become mutually coupled until one of the switches Q1 or Q2 is actively switched by the controller 520 through an associated gate driver. The two points of mutually coupled inductance, for example, may include the first gate loop inductance 530 and/or the second gate loop inductance 529 found within the gate driver loop 554 and the power module inductance 531 existing in the power loop 552. However, these are merely exemplary points of mutual coupling, and any other combination of inductances may also be mutually coupled as well. The benefit of only having to use the controller 520 to actively switch on/off one of the switches Q1 and Q2 may be a reduced complexity in the algorithms required to manage the mitigation of oscillations achieved by the techniques described herein. The process may also be more repeatable and less susceptible to variations over time. For example, for a traditional controller to achieve this process by actively switching both upper switch Q1 and lower switch Q2, there may be a 'jitter effect' that may limit the precision of the gate signal overlap. The reason why it is more repeatable may be that the inductance and the coupling mechanism may not degrade over time, or rely on electronics. It instead may use magnetic energy (for example, the magnetic flux as described below), which can be precisely mapped to an operating current. Furthermore, the amount of physical circuit elements present may also be reduced, thus resulting in both software and hardware complexity reductions.

In terms of the exemplary mutual coupling process depicted in FIG. 5, the controller 520 may provide a signal to gate driver 518, which may be associated lower switch Q2 (may drive lower switch Q2 into an on state). In some instances, the signal may be a pulse width modulation (PWM) control signal as described above. The signal may trigger the gate driver 518 to provide a current to lower switch Q2 that may be used to turn on the lower switch Q2. During this active switching on of the lower switch Q2, the current flowing through the power module inductance 531 may cause a magnetic flux, which may, in turn, induce a voltage and current in gate driver loop 554 associated with gate driver 516 and switch Q1 as shown in the figure. This may effectively result in a mutual inductor with an air core forming between the second power module inductance 531 and the first gate loop inductance 530 and/or the second gate loop inductance 529 in the gate driver loop 554. The degree of the induced voltage and current due to magnetic flux coupling may be a function of the core material, spatial orientation, and distance of separation. This mutual coupling of the power and gate loop to may be used to achieve the same shoot through condition as described above with respect to FIG. 3 above. That is, the induced voltage in the gate loop inductances 530 and/or 529 in the gate driver loop 554 may serve to switch Q1 that is not actively turned on/off by the controller 520. It should be noted that although FIG. 5 depicts Q2 being actively switched on/off by the controller 520 and Q1 being passively switched on/off through the mutual coupling, the switch Q1 may instead be actively switched and the switch Q2 may be passively switched. Additionally, while the above description includes the second power module inductance 531 creating the magnetic flux that results in the mutual inductor, any other inductances and/or combination of inductances may similarly be the originating point of the magnetic flux as well.

Also depicted in the figure, the inductances associated with this mutual coupling may include associated polarities (for example, as represented by an arrow next to each inductance depicted on the circuit). Depending on whether a turn on or turn off event for Q2 is initiated through the controller 520, Q1 may still need to be turned on. In order to do so, the two inductances (for example, gate loop inductance 530 and second gate loop inductance 529) in the gate driver loop 554 may be oppositely polarized (as indicated by the arrows pointing in opposite directions next to each of the two inductances in the gate driver loop). The diodes D1 and D2 may be used to block the voltages of their corresponding gate loop inductance, otherwise the two inductances may simply be shorted together. The operation of these elements in the gate drive loop 554 may include the following. When Q2 is actively turned on through the controller 520, current may flow through power module inductance 531 in the direction of the arrow (positive polarity). Additionally, the voltage across the gate loop inductance 530 may be positive and the voltage across the second gate loop inductance 529 may be negative. Thus, the voltage of the gate loop inductance 530 may be used to turn on Q1 and the diode D1 is used to block the negative voltage of second gate loop inductance 529. When Q2 is switched off by the controller 520, the polarities of the inductances in the gate driver loop 554 may be reversed, such that the voltage across gate loop inductance 530 may be negative and the voltage across second gate loop inductance 529 may be positive. The diode D2 may be used to block the negative voltage of gate loop inductance 530 and the diode D1 may allow the voltage of second gate loop inductance 529 to passively turn on Q1.

Figure 6:
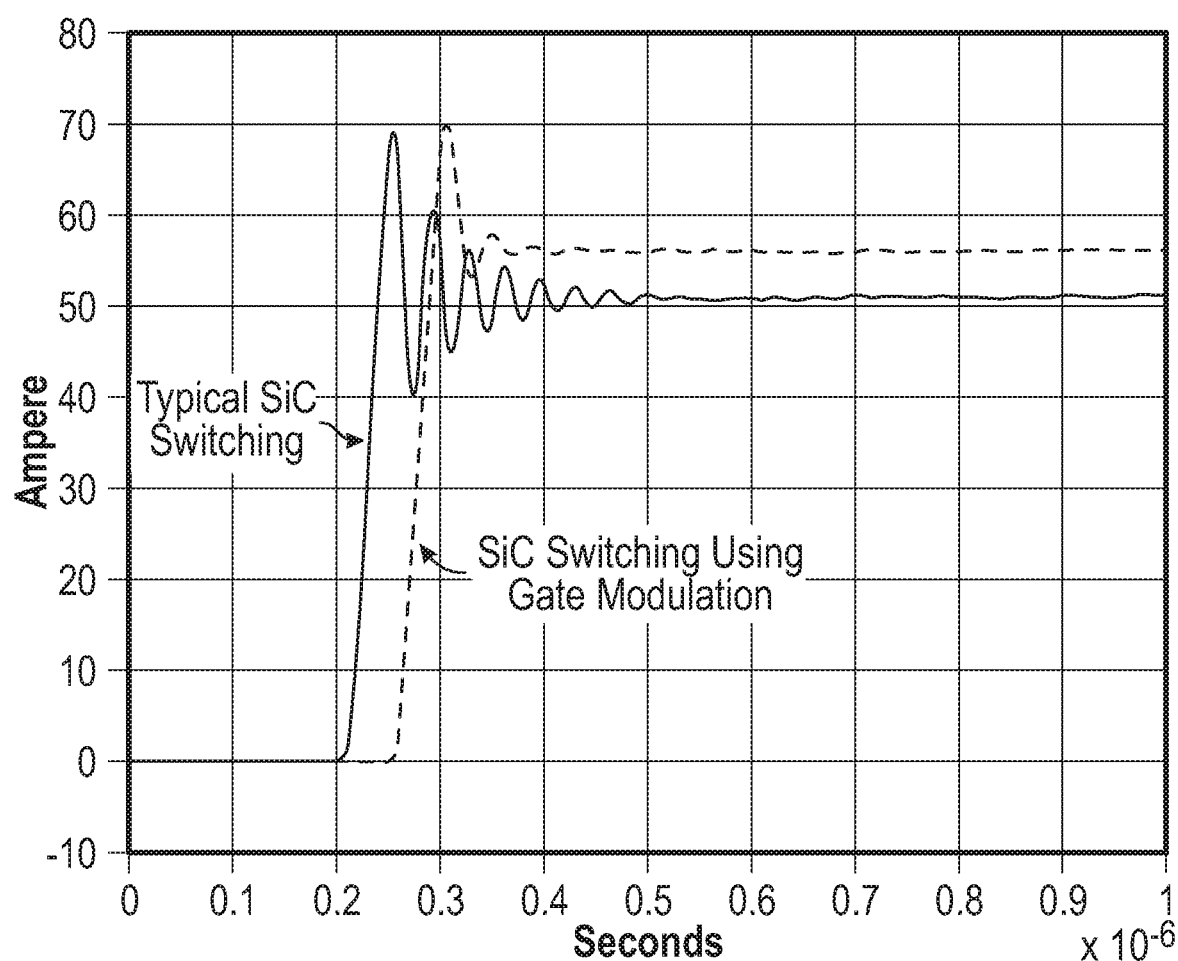
FIG. 6 is a graph comparing oscillations associated with the conventional circuit operation shown in FIG. 2 to oscillations associated with the gate modulation technique shown in FIG. 3.

FIG. 6 shows a graph illustrating a comparison between oscillations produced during the conventional circuit operation shown in FIG. 2 and oscillations produced while using the gate modulation technique shown in FIG. 3 and described herein. As shown, conventional operation of SiC switches results in significant ringing or oscillations at initial turn-on, while SiC switches using gate modulation have reduced oscillations at turn-on and faster di/dt.

Thus, unlike conventional system, the gate modulation technique described herein utilizes the inherent properties of semiconductor switches to minimize ringing, or oscillations, rather than relying on additional hardware to achieve this result. In addition, the gate modulation technique can be easily enabled or disabled for a given circuit by simply adjusting the inputs provided by the controller to the first and second switches, thus providing another advantage over conventional systems.

Any process descriptions or blocks in the figures, such as FIG. 4, should be understood as representing modules, segments, or portions of code which include one or more executable instructions for implementing specific logical functions or steps in the process, and alternate implementations are included within the scope of the embodiments described herein, in which functions may be executed out of order from that shown or discussed, including substantially concurrently or in reverse order, depending on the functionality involved, as would be understood by those having ordinary skill in the art.

It should be emphasized that the above-described embodiments, particularly, any "preferred" embodiments, are possible examples of implementations, merely set forth for a clear understanding of the principles of the invention. Many variations and modifications may be made to the above-described embodiment(s) without substantially departing from the spirit and principles of the techniques described herein. All such modifications are intended to be included herein within the scope of this disclosure and protected by the following claims.

The invention claimed is:

1. A power conversion circuit, comprising:
a controller;
a power loop;
a first power amplifier and a second power amplifier, wherein both the first power amplifier and the second power amplifier are electrically coupled to the controller;
a gate control loop comprising:
a first semiconductor switch with a first gate electrically coupled to the first power amplifier; and
a second semiconductor switch with a first gate electrically coupled to the second power amplifier,
wherein the controller is configured to drive the first power amplifier to create a period of operational overlap for the first and second semiconductor switches by setting a gate voltage of the first semiconductor switch to an intermediate value above a threshold voltage of the first semiconductor switch,
wherein a magnetic coupling is formed between a parasitic inductance in the power loop and a parasitic inductance in the gate control loop, and
wherein the second semiconductor switch is turned on by the magnetic coupling.

2. The power conversion circuit of claim 1, wherein to create the period of operational overlap, the controller is configured to:
at a first time, set the gate voltage of the first semiconductor switch to the intermediate value; and
at a second time, set the gate voltage of the first semiconductor switch to a low value.

3. The power conversion circuit of claim 2, wherein the second semiconductor switch is turned on by the magnetic coupling at a third time between the first time and the second time.

4. The power conversion circuit of claim 3, wherein a duration between the third time and the second time is selected to avoid damage caused by a short-circuit during the period of operation overlap.

5. The power conversion circuit of claim 1, wherein the threshold voltage is a minimum amount of charge define by operational characteristics of the first semiconductor switch that is required at the gate to provide a conductive path between a drain and a source of the first semiconductor switch.

6. The power conversion circuit of claim 1, wherein during the period of operational overlap, a short-circuit occurs between a drain of the first semiconductor switch and ground of the power conversion circuit connected to a source of the second semiconductor switch.

7. The power conversion circuit of claim 6, wherein the intermediate value is set to control a surge current during the short-circuit.

8. The power conversion circuit of claim 1, wherein the first and second semiconductor switches are metal oxide semiconductor field-effect transistors (MOSFETs) comprising a wide band gap semiconductor material.

9. The power conversion circuit of claim 8, wherein the wide band gap semiconductor material is Silicon Carbide (SiC).

10. The power conversion circuit of claim 1, including:
a first diode in parallel with a drain and a source of the first semiconductor switch; and
a second diode in parallel with a drain and a source of the second semiconductor switch.

11. The power conversion circuit of claim 10, wherein the first and second diode are made of Silicon Carbide (SiC).

12. A method comprising:
driving, by a controller, a first power amplifier of a circuit, the circuit comprising:
a power loop;
the first power amplifier and a second power amplifier, wherein both the first power amplifier and the second power amplifier are electrically coupled to the controller;
a first semiconductor switch with a first gate electrically coupled to the first power amplifier; and
a second semiconductor switch with a first gate electrically coupled to the second power amplifier; and
a gate control loop located between the first power amplifier and the first semiconductor switch; and
passively driving the second semiconductor switch through a magnetic coupling between a parasitic inductance in the power loop and a parasitic inductance in the gate control loop,
wherein driving the first power amplifier creates a period of operational overlap for the first and second semiconductor switches by setting a gate voltage of the first semiconductor switch to an intermediate value above a threshold voltage of the first semiconductor switch.

13. The method of claim 12, further comprising:
at a first time, setting the gate voltage of the first semiconductor switch to the intermediate value; and
at a second time, setting the gate voltage of the first semiconductor switch to a low value.

14. The method of claim 13, wherein the second semiconductor switch is turned on by the magnetic coupling at a third time between the first time and the second time.

15. The method of claim 12, wherein the threshold voltage is a minimum amount of charge define by operational characteristics of the first semiconductor switch that is required at the gate to provide a conductive path between a drain and a source of the first semiconductor switch.

16. The method of claim 12, wherein during the period of operational overlap, a short-circuit occurs between a drain of the first semiconductor switch and ground of the power conversion circuit connected to a source of the second semiconductor switch.

17. The method of claim 16, wherein the intermediate value is set to control a surge current during the short-circuit.

18. The method of claim 12, wherein the first and second semiconductor switches are metal oxide semiconductor field-effect transistors (MOSFETs) comprising a wide band gap semiconductor material.

19. The method of claim 18, wherein the wide band gap semiconductor material is Silicon Carbide (SiC).

20. The method of claim 12, including:
a first diode in parallel with a drain and a source of the first semiconductor switch; and
a second diode in parallel with a drain and a source of the second semiconductor switch.

* * * * *